United States Patent
Yang (10) Patent No.: US 7,344,926 B2
(45) Date of Patent: Mar. 18, 2008

(54) LIQUID CRYSTAL DISPLAY DEVICE AND METHOD OF MANUFACTURING THE SAME

(75) Inventor: Joon Young Yang, Gyeonggi-Do (KR)

(73) Assignee: LG. Philips LCD Co., Ltd, Seoul (KR)

( * ) Notice: Subject to any disclaimer, the term of this patent is extended or adjusted under 35 U.S.C. 154(b) by 12 days.

(21) Appl. No.: 11/267,335

(22) Filed: Nov. 7, 2005

(65) Prior Publication Data

US 2006/0097261 A1  May 11, 2006

(30) Foreign Application Priority Data

Nov. 8, 2004  (KR) ............ 10-2004-0090334

(51) Int. Cl.
*H01L 21/00* (2006.01)
(52) U.S. Cl. ............. 438/149; 438/30; 257/E21.411; 257/E21.412
(58) Field of Classification Search ............ 438/22, 438/30, 149; 257/E21.411, E21.412
See application file for complete search history.

(56) References Cited

U.S. PATENT DOCUMENTS

| | | | | |
|---|---|---|---|---|
| 4,859,623 | A * | 8/1989 | Busta | 438/30 |
| 5,614,730 | A * | 3/1997 | Nakazawa et al. | 257/59 |
| 6,307,214 | B1 * | 10/2001 | Ohtani et al. | 257/59 |
| 6,403,409 | B1 | 6/2002 | You | |
| 6,617,203 | B2 * | 9/2003 | Kim et al. | 438/149 |
| 6,667,494 | B1 * | 12/2003 | Yamazaki et al. | 257/59 |
| 6,753,235 | B2 | 6/2004 | So et al. | |
| 6,784,032 | B2 * | 8/2004 | Lee et al. | 438/149 |
| 2001/0003657 | A1 | 6/2001 | Lee | |
| 2004/0222421 | A1 * | 11/2004 | Lee et al. | 257/66 |
| 2004/0266039 | A1 * | 12/2004 | Ahn et al. | 438/30 |
| 2004/0266040 | A1 * | 12/2004 | Kim et al. | 438/30 |
| 2005/0019969 | A1 * | 1/2005 | Chang et al. | 438/30 |
| 2005/0077516 | A1 * | 4/2005 | Lim et al. | 257/59 |
| 2005/0077524 | A1 * | 4/2005 | Ahn et al. | 257/72 |
| 2005/0139836 | A1 * | 6/2005 | Oh | 257/72 |
| 2005/0142680 | A1 * | 6/2005 | Ha et al. | 438/30 |
| 2006/0003479 | A1 * | 1/2006 | Park et al. | 438/30 |
| 2006/0051886 | A1 * | 3/2006 | Park et al. | 438/30 |
| 2007/0020822 | A1 * | 1/2007 | Chou et al. | 438/149 |

* cited by examiner

*Primary Examiner*—Michael Lebentritt
*Assistant Examiner*—Grant S Withers
(74) *Attorney, Agent, or Firm*—Seyfarth Shaw LLP (57) ABSTRACT

A liquid crystal display device including first and second active layers over a substrate, a storage line over the second active layer, a first insulating layer over the storage line, a gate electrode on the first insulating layer and corresponding to the first active layer, a second insulating layer over the gate electrode, source and drain electrodes connected to the first active layer through the first and second insulating layers, a gate line connected to the gate electrode through the second insulating layer, a data line substantially perpendicularly arrange with respect to the gate line to define a pixel region, a pixel electrode connected to the drain electrode through the second insulating layer, and a connection line connected to one of the gate line and the data line through the second insulating layer.

28 Claims, 6 Drawing Sheets

LIQUID CRYSTAL DISPLAY DEVICE AND METHOD OF MANUFACTURING THE SAME

CROSS-REFERENCE TO RELATED APPLICATIONS

The present invention claims the benefit of Korean Patent Application No. 090334/2004 filed in Korea on Nov. 8, 2004, which is hereby incorporated by reference in its entirety.

BACKGROUND OF THE INVENTION

1. Field of the Invention

The present invention relates to a liquid crystal display (LCD), and more particularly, to an array substrate of an LCD and a method of manufacturing the same.

2. Description of the Related Art

An LCD is considered to be the next generation of display device because it has good portability and low power consumption, and also has a good performance in terms of resolution and digital adaptability. The LCD is a non-self-luminous display device in which liquid crystal is positioned between a color filter substrate and an array substrate having a thin film transistor (TFT). An image is displayed by using the anisotropy of the liquid crystal and the different refractivity of light transmitted through the LCD from a backlight unit.

An active matrix (AM) LCD is typically used as an LCD. In the AMLCD, a TFT is positioned in each of the pixels. The TFT serves as a switching device that adjusts the arrangement of the liquid crystals in the pixel to change the transmittance of the pixel. Such a TFT is generally formed of amorphous silicon (a-Si). The reason for the use of a-Si is that numerous a-Si TFTs can be easily formed over a large area by depositing a-Si at a temperature less than 350° C., patterning the a-Si, doping the a-Si, and then depositing a low-priced insulating layer at a temperature less than 350° C.

Amorphous silicon has a disordered atomic arrangement in which the Si—Si bonding is weak and also a dangling bond. Accordingly, when light or an electric field is applied thereto, amorphous silicon is changed into a quasi-stable state, which is unstable for use as a TFT. More specifically, the electrical characteristics of the amorphous silicon degrade as a result of light irradiation, and thus light irradiated a-Si is difficult to use for a driving circuit due to its low electric field mobility (0.1-1.0 cm$^2$/V·s) and low reliability. Also, since the a-Si TFT array substrate and a printed circuit board (PCB) with the driving IC for the a-Si TFT array substrate are connected by having the driving IC on a tape carrier package (TCP), the installation cost and the cost of the driving IC occupies a large part of the manufacturing cost. Further, when the resolution of the LCD increases, it is difficult to perform the bonding process between the a-Si TFT array substrate and the TCP because a pad pitch for connecting the gate and data lines of the a-Si TFT array substrate to the TCP becomes smaller.

Polysilicon has higher electric field mobility than the amorphous silicon. Polysilicon can be used in driving circuits that are directly mounted on the TFT array substrate of a high resolution panel. Further, polysilicon can be used for the TFT switching device of the high-resolution panel when the driving circuit is directly mounted on the array substrate because the driving circuit is also made of polysilicon. Thus, the cost for connecting the driving IC can be reduced and the driving IC can be simply mounted. In addition, the polysilicon can be efficiently used in a display device transmitting a large amount of light because polysilicon has a smaller photocurrent than amorphous silicon.

Figure 1A:
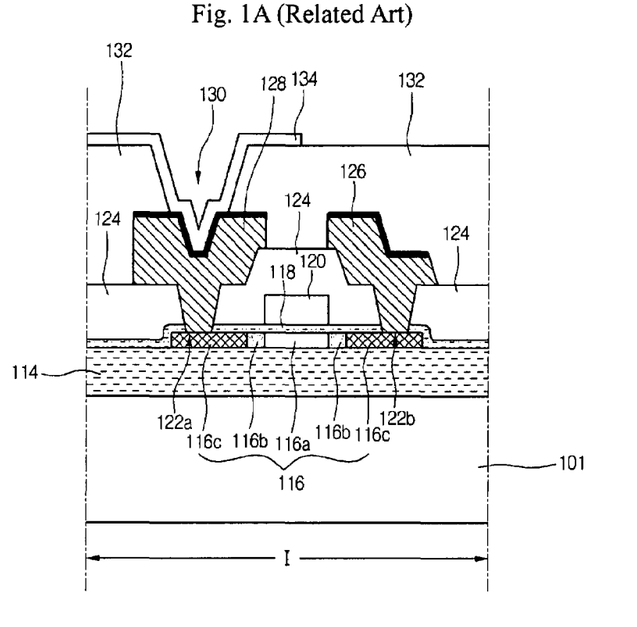
FIGS. 1A and 1B are cross-sectional views of a TFT of a pixel unit and a CMOS TFT of a driving circuit unit in a related art LCD.
Figure 1B:
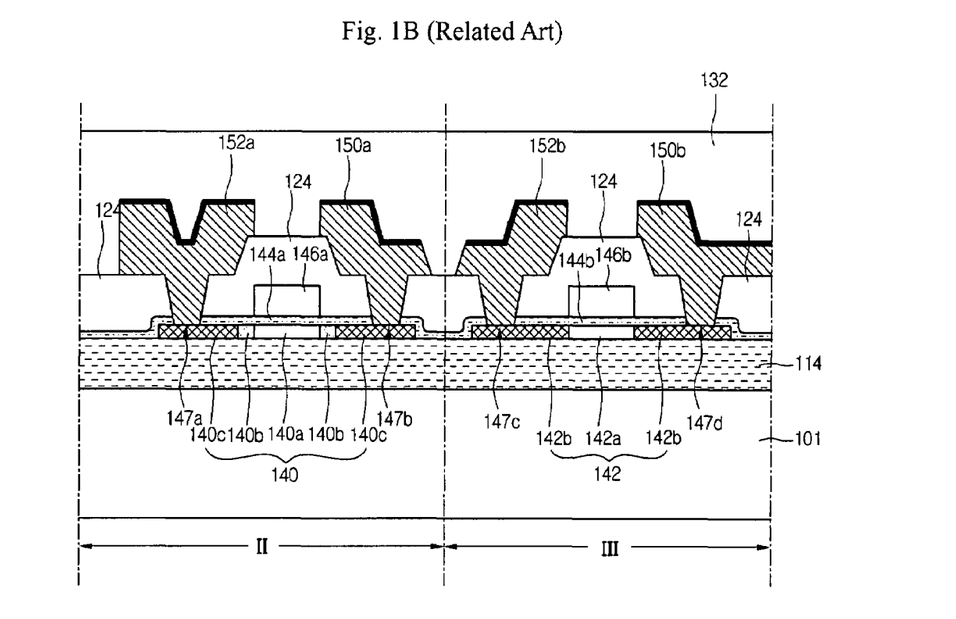

The structure of a TFT of a related art LCD will now be described in detail with reference to FIGS. 1A and 1B. Respectively, FIG. 1A is a cross-sectional view of a TFT in a pixel unit of a related art LCD and FIG. 1B is a cross-sectional view of a CMOS TFT in a driving circuit unit of a related art LCD. Both the pixel unit and the driving circuit unit include a top gate type TFT having a gate electrode disposed above the semiconductor layer of the TFT.

Referring to FIG. 1A, a TFT unit I of a pixel region of a related art LCD includes: a transparent insulating substrate 101 as a substrate, a buffer layer 114 formed on the insulating substrate 101, a semiconductor layer 116 formed on the buffer layer 114, and a gate insulating layer 118 and a gate electrode 120 sequentially stacked on the semiconductor layer 116. An interlayer insulating layer 124, including first and second semiconductor contact holes 122a and 122b, is formed over the gate electrode 120 and the gate insulating layer 118. Source and drain electrodes 126 and 128 are formed on the interlayer insulating layer 124 to overlap the gate electrode 120 and to be spaced apart from each other by a predetermined distance. The source and drain electrodes 126 and 128 are connected to the semiconductor layer 116 through the first and second semiconductor contact holes 122a and 122b, respectively.

A passivation layer 132 including a drain contact hole 130 is formed over the source and drain electrodes 126 and 128, and the interlayer insulating layer 124. A pixel electrode 134 is formed on the passivation layer 132. The pixel electrode 134 is connected to the drain electrode 128 through the drain contact hole 130.

The semiconductor layer 116 includes: an n+ impurity regions 116c respectively contacting the source electrode 126 and drain electrode 128, an active region 116a between the n+ impurity regions 116c, and lightly doped drain (LDD) regions 116b respectively formed between the active region 116a and the n+ impurity regions 116c contacting the source and drain electrodes 126 and 128. The LDD regions 116b are provided for hot carrier distribution. Thus, the LDD regions 116b are doped at a low concentration to prevent the loss on-state current as well as to prevent leakage current.

Referring to FIG. 1B, a CMOS TFT of the driving circuit unit includes a TFT unit II having a channel doped with n-type ions, and a TFT unit III having a channel doped with p-type ions. The same reference numerals are used to denote the same elements.

A buffer layer 114 is formed on a transparent insulating substrate 101. An n-type semiconductor layer 140 and a p-type semiconductor layer 142 are formed on a buffer layer 114 such that they are spaced apart from each other by a predetermined distance. Gate insulating layers 144a and 144b and gate electrodes 146a and 146b are formed on the n-type semiconductor layer 140 and the p-type semiconductor layer 142, respectively. An interlayer insulating layer 124, including semiconductor layer contact holes 147a, 147b, 147c and 147d, is formed on the gate electrodes 146a and 146b, and over the gate insulating layers 144a and 144b.

Source electrodes 150a and 150b and drain electrodes 152a and 152b are formed on the interlayer insulating layer 124 such that they are respectively connected to the n-type semiconductor layer 140 and the p-type semiconductor layer 142 through the semiconductor layer contact holes 147a, 147b, 147c and 147d. A passivation layer 132 is formed on the source electrodes 150a and 150b and also on the drain electrodes 152a and 152b as well as over the surface of the interlayer insulating layer 124.

The n-type semiconductor layer 140 includes: an n+ impurity regions 140c respectively contacting the source electrode 150a and drain electrode 152a, an active region 140a between the n+ impurity regions 140c, and lightly doped drain (LDD) regions 140b between the active region 140a and the n+ impurity regions 140c. Since the p-type semiconductor layer 142 of the p-type TFT unit III is formed to use carriers charged with a positive charge, it is less affected by a leakage current and degradation of carriers than the n-type TFT unit II. Thus, the p-type semiconductor layer 142 of the p-type TFT unit III does not include LDD regions. Accordingly, the p-type semiconductor layer 142 includes: a p-type impurity regions 142b respectively contacting the source electrode 150b and the drain electrode 152b, and an active region 142a between the p-type impurity regions 142b.

A method of manufacturing the TFT of the pixel unit and the CMOS TFT of the driving circuit unit will now be described with reference to FIG. 2, which is a flow chart illustrating a method of manufacturing the related art LCD. Each of the processes in the method shown in FIG. 2 includes a photolithography process (hereinafter referred to as a "mask process") using a photoresist (PR).

Figure 2:
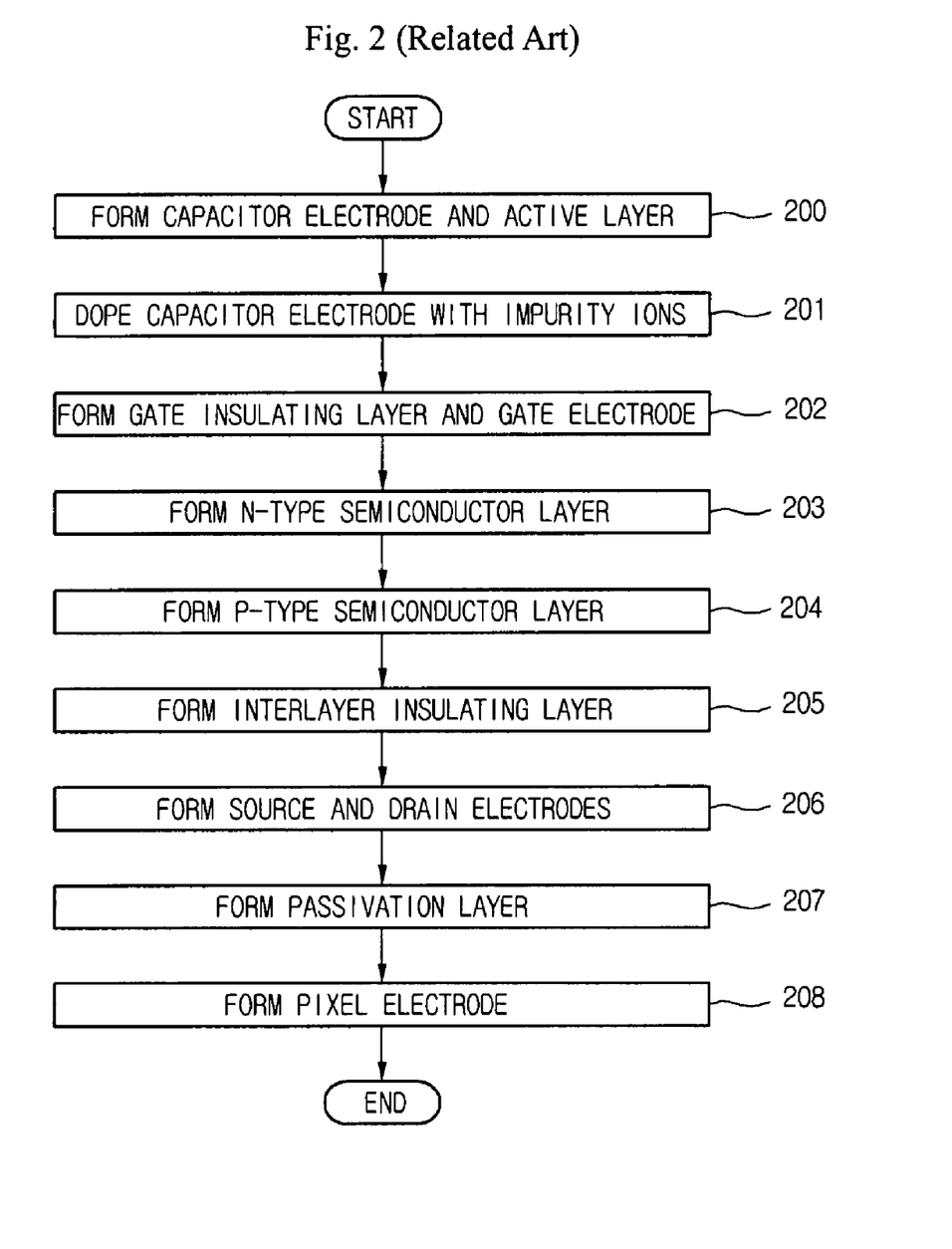
FIG. 2 is a flow chart illustrating a method of manufacturing the related art LCD.

As shown in FIG. 2, an active layer and a first capacitor electrode are formed in process 200. First, a buffer layer is formed on a transparent insulating substrate. The buffer layer is formed mainly of an inorganic insulating layer, such as a silicon nitride ($SiN_x$) layer or a silicon oxide ($SiO_x$) layer. Thereafter, amorphous silicon is deposited on the buffer layer. The amorphous silicon is dehydrogenated and crystallized to form crystalline silicon, such as monocrystalline silicon or polycrystalline silicon. A first mask process is performed on the crystalline silicon to form the active layer and the first capacitor electrode.

In process 201, as shown in FIG. 2, a second mask process is performed to expose the first capacitor electrode so as to dope the first capacitor electrode. A photoresist pattern is formed to cover the active layer. Thereafter, the first capacitor electrode is doped with n+ impurities using the photoresist pattern as a mask. Thereafter, the photoresist pattern is stripped.

In process 202, as shown in FIG. 2, a gate insulating layer and a gate electrode are formed. A silicon nitride layer and aluminum (Al) is sequentially deposited on the substrate having the active layer. Then, the gate insulating layer and the gate electrode are formed through a third mask process.

In process 203, as shown in FIG. 2, an n-type semiconductor layer is formed. N-impurities are doped onto the substrate including the gate insulating layer and the gate electrode to form LDD regions in the semiconductor layer. Thereafter, n+ impurity regions are formed into the semiconductor layer with n+ impurities doped through a fourth mask process.

In process 204, as shown in FIG. 2, a p-type semiconductor layer is formed. P-type impurity regions doped with p+impurities are formed on the substrate having the n-type semiconductor layer through a fifth mask process.

In process 205, as shown in FIG. 2, an interlayer insulating layer is formed. An inorganic insulating layer (e.g., a silicon nitride layer or a silicon oxide layer) is deposited on the substrate having both the p-type semiconductor layer and n-type semiconductor layer. Then, contact holes for contacting the semiconductor layers are formed in the interlayer insulating layer through a sixth mask process.

In process 206, as shown in FIG. 2, source and drain electrodes are formed. Molybdenum (Mo) and aluminum neodymium (AlNd) are sequentially deposited on the interlayer insulating layer. A batch etching is then performed through a seventh mask process to form the source and drain electrodes connected to the impurity regions through the contact holes.

In process 207, as shown in FIG. 2, a passivation layer is formed. A silicon nitride layer is formed over the source and drain electrodes on the substrate. Thereafter, the silicon nitride layer is thermally hydrogenated. At this time, the thermal hydrogenation process includes an annealing process and is performed once using $N_2$ gas at 380° C. The thermal hydrogenation process serves to move hydrogen contained in the silicon nitride layer to the bottom surface. In the TFT unit I of the pixel unit, a drain contact hole for contacting with the drain electrode is formed in the passivation layer through an eighth mask process.

In process 208, as shown in FIG. 2, a pixel electrode is formed. This process further builds the TFT unit I of the pixel unit. An indium tin oxide (ITO) is deposited on the passivation layer. The pixel electrode connected to the drain electrode through the drain contact hole is formed through a ninth mask process, which etches the ITO.

As described above, the related art method of manufacturing the LCD requires nine mask processes. Nine mask processes require a large amount of time and are costly. Accordingly, researches are actively conducted to reduce the number of the mask processes. When the number of the mask processes is reduced, manufacturing time and cost are reduced.

SUMMARY OF THE INVENTION

Accordingly, the present invention is directed to an array substrate of an LCD and a method of manufacturing the same that substantially obviate one or more problems due to limitations and disadvantages of the related art.

An object of the present invention is to provide a liquid crystal display device and a method of manufacturing the same in which manufacturing processes are simplified.

Another object of the present invention is to provide a liquid crystal display device and a method of manufacturing the same in which manufacturing costs are reduced.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described herein, there is provided a liquid crystal display device including first and second active layers over a substrate, a storage line over the second active layer, a first insulating layer over the storage line, a gate electrode on the first insulating layer and corresponding to the first active layer, a second insulating layer over the gate electrode, source and drain electrodes connected to the first active layer through the first and second insulating layers, a gate line connected to the gate electrode through the second insulating layer, a data line substantially perpendicularly arrange with respect to the gate line to define a pixel region, a pixel electrode connected to the drain electrode through the second insulating layer, and a connection line connected to one of the gate line and the data line through the second insulating layer.

In another aspect of the present invention, there is provided a liquid crystal display device including an active layer over a substrate, a first electrode on the active layer, a first insulating layer over the first electrode, a gate electrode on the first insulating layer corresponding to the active layer, a second insulating layer over the gate electrode, source and drain electrodes connected to the active layer through the first and second insulating layers, a gate line connected to the gate electrode through the second insulating layer, a data line substantially perpendicularly arrange with respect to the gate line to define a pixel region, a pixel electrode connected to the drain electrode through the second insulating layer, a second electrode formed on the first insulating layer and overlapping the first electrode, and a connection line connected to one of the gate line and the data line through the second insulating layer.

In another aspect of the present invention, there is provided a method of manufacturing a liquid crystal display device that includes forming silicon and a first metal material over a substrate, forming a first silicon pattern and a stack of a second silicon pattern and a storage line using a diffraction mask, forming a first insulating layer over the substrate, forming a second metal material on the substrate and patterning the second metal material to form a gate electrode, a pixel electrode, and a connection line, performing ion implantation on the first and second silicon patterns to form first and second active layers, forming a second insulating layer including a plurality of contact holes for exposing the first active layer, the gate electrode, the pixel electrode, and the connection line, and depositing a third metal material over the second insulating layer and forming the third metal material to form a gate line connected to the gate electrode, source and drain electrodes connected to the first active layer, and a data line connected to the source electrode.

In yet another aspect of the present invention, there is provided a method of manufacturing a liquid crystal display device that includes forming silicon and a first metal material over a substrate, forming silicon patterns and a first electrode using a diffraction mask, forming a first insulating layer over the silicon patterns and the first electrode, forming a second metal material over the first insulating layer and patterning the second metal material to form a gate electrode, a pixel electrode, a second electrode, and a connection line, performing ion implantation on the silicon patterns to form an active layer, forming a second insulating layer including a plurality of contact holes for exposing the active layer, the gate electrode, the pixel electrode, and the connection line, and forming a third metal material on the second insulating layer and patterning the third metal material to form a gate line connected to the gate electrode, source and drain electrodes connected to the first active layer, and a data line connected to the source electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 3:
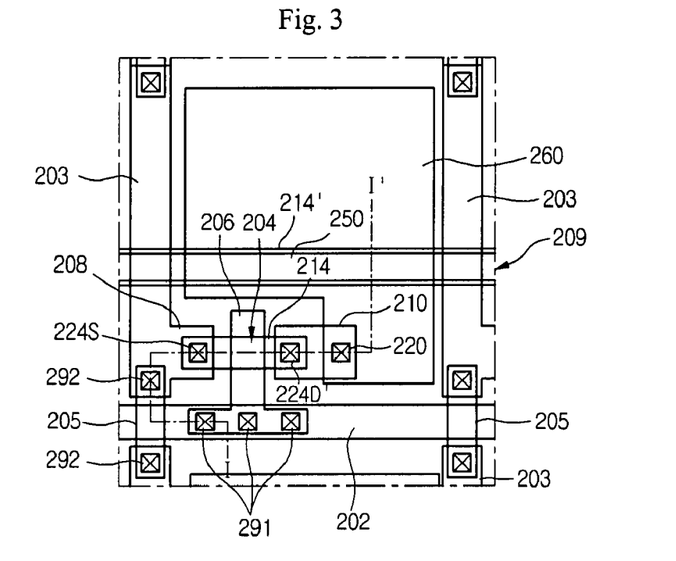
FIG. 3 is a plan view of an array substrate of an LCD according to an embodiment of the present invention.
Figure 4:
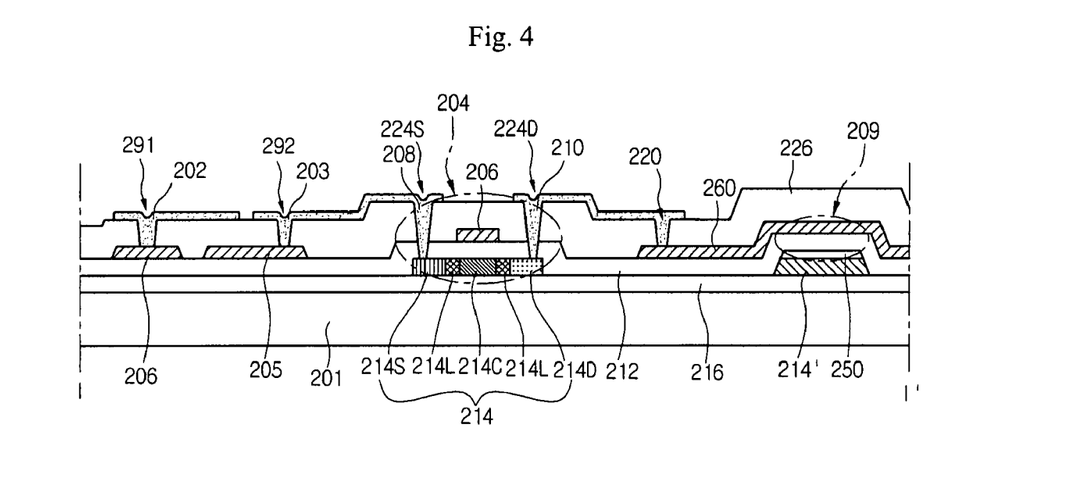
FIG. 4 is a cross-sectional view taken along line I-I' in FIG. 3.

FIG. 3 is a plan view of an array substrate of an LCD according to an embodiment of the present invention, and FIG. 4 is a cross-sectional view taken along line I-I' in FIG. 3.

Referring to FIGS. 3 and 4, a gate line 202 and a data line 203 are arranged perpendicularly with respect to each other and are insulated from each other. A TFT 204 is disposed adjacent to where the gate line 202 and the data line 203 are closest to each other. A pixel region is defined between the gate line 202 and the data line 203. A pixel electrode 260 is connected to the TET 204 and disposed within the pixel region. A gate electrode 206 of transparent conductive material is connected from the gate line 202 to the TFT 204. During the formation of the gate electrode 206, the pixel electrode 260 is also formed of the transparent conductive material in the pixel region. The TFT 204 switches in response to a scan pulse from the gate line 202 such that a video signal from the data line 203, that is, a pixel signal, is applied across the liquid crystal of the pixel region.

The gate line 202 is spaced apart from the data line 203 by a predetermined distance within a gap between two data lines 203. That is, the data line 203 is disconnected from the gate line 202 at the gap. The data line 203 on one side of the gap is electrically connected to the data line 203 on the other side of the gap by a connection line 205. Like the gate electrode 206, the connection line 205 is formed of a transparent conductive material.

In the TFT 204, the gate electrode 206 formed of a transparent conductive material is formed over a first active layer 214 with a gate insulating layer 212 disposed therebetween. Source and drain electrodes 208 and 210 of the TFT are formed over the gate electrode 206 with an interlayer insulating layer 226 disposed therebetween such that they are spaced apart from each other by a predetermined distance. The first active layer 214 of the TFT includes a channel region 214C overlapped by the gate electrode 206, a source region 214S contacting the source electrode 208 through a source contact hole 224S and implanted with n+ ions, a drain region 214D contacting the drain electrode 210 through a drain contact hole 224D and implanted with n+ ions, and an LDD regions 214L formed between the channel region 214C and the drain region 214D, and between the channel region 214C and the source region 214S.

While the TFT 204 is formed, a storage capacitor 209 is also formed. A storage line 250 and a second active layer 214' are formed on a buffer layer 216 in the pixel region. Then, the pixel electrode 260 is formed over the storage line 250 with the gate insulating layer 212 interposed therebetween, thereby forming the storage capacitor 209. The buffer layer 216 is formed over the surface of a substrate 201.

The gate electrode 206, the connection line 205, and the pixel electrode 260 are formed of the same material, that is, the transparent conductive material. The transparent conductive material is one of indium-tin-oxide (ITO), indium-zinc-oxide (IZO), and indium-tin-zinc-oxide (ITZO). Further, the gate electrode 206, the connection line 205, and the pixel electrode 260 are formed on the gate insulating layer 212.

The interlayer insulating layer 226 is formed over the TFT 204 and the storage capacitor 209. A gate contact hole 291 for exposing the gate electrode 206, source and drain contact holes 224S and 224D for exposing the source and drain regions 214S and 214D, a pixel contact hole 220 for exposing the pixel electrode 260, and a connection contact hole 292 for exposing a portion of the connection line 205 connecting the data line 203 are formed in the interlayer insulating layer 226. The source electrode 208 extends from the data line 203 to contact the source region 214S of the first active layer 214 through the source contact hole 224S, and the drain electrode 210 is spaced apart from the source electrode 208 by a predetermined distance and contacts the drain region 214D of the first active layer 214 through the drain contact hole 224D. The drain electrode 210 contacts the pixel electrode 260 through the pixel contact hole 220, and the data line 203 contacts with the connection line 205 through the connection contact hole 292.

Although not shown in the drawings, a gate driving circuit unit and a data driving circuit unit each include a plurality of CMOS circuits. Each of the CMOS circuits includes a p-type TFT and an n-type TFT. The n-type TFT is doped with arsenic (As) or phosphorous (P) impurities, and the p-type TFT is doped with boron (B) impurities in the source and drain regions of the first active layer.

Figure 5A:
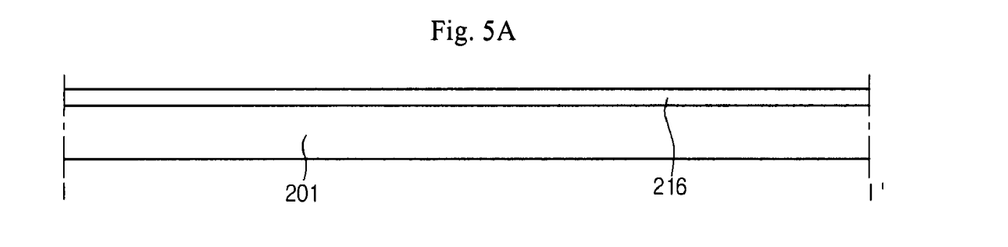
FIGS. 5A through 5E are cross-sectional views illustrating a method of manufacturing a TFT array substrate of an LCD according to an embodiment of the present invention.

FIGS. 5A through 5E are cross-sectional views illustrating a method of manufacturing a TFT array substrate of an LCD according to an embodiment of the present invention. Referring to FIG. 5A, a buffer layer 216 is formed over the surface of a substrate 201. The buffer layer 216 is formed of an inorganic insulating layer, such as a silicon nitride ($SiN_x$) layer or a silicon oxide ($SiO_x$) layer.

Figure 5B:
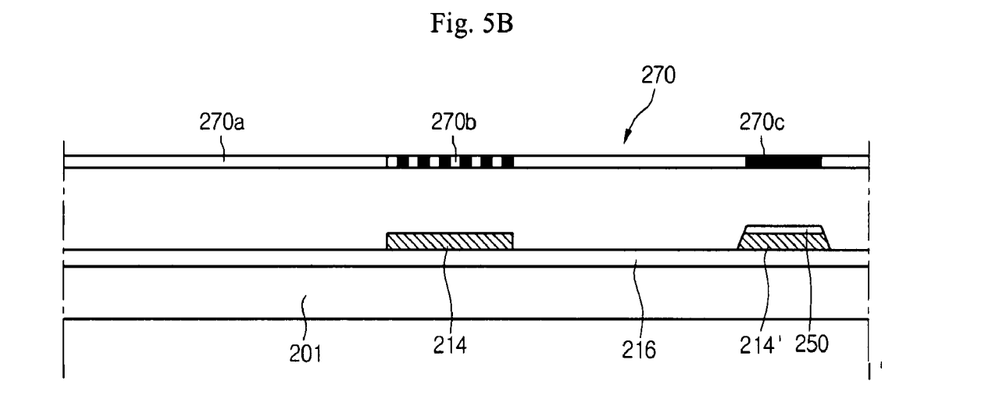

As shown in FIG. 5B, first and second active layers 214 and 214' are formed on portions of the buffer layer 216. More specifically, amorphous silicon (a—Si) is deposited on the surface of the buffer layer 216 by plasma enhanced chemical vapor deposition (PECVD) or sputtering. Thereafter, in order to prevent the degradation of a subsequent crystallization process, the amorphous silicon is dehydrogenated at about 400° C. The hydrogen mixed into the amorphous silicon is removed through the dehydrogenation process. The dehydrogenated amorphous silicon is crystallized into polysilicon as a silicon layer. Thereafter, a metal material is deposited on the polysilicon, a photoresist is coated so as to pattern the polysilicon and the metal material, and a storage line 250 is formed by a diffraction exposure process using a diffraction mask 270. The use of the diffraction exposure process prevents the need for a separate mask for just removing metal material.

The diffraction mask 270 includes a full exposure portion 270a that transmits light, a partial exposure portion 270b that transmits only a part of light by diffraction and disappearance, and a full block portion 270c that fully blocks light. The full block portion 270c corresponds to a portion at which the storage line 250 is intended to be formed, and the partial exposure portion 270b corresponds to a portion at which the first active layer 214 is intended to be formed. Accordingly, the storage line 250 is formed in a double layer structure having the second active layer 214' and the metal material. The storage line 250 is formed in parallel to the gate line 202.

Figure 5C:
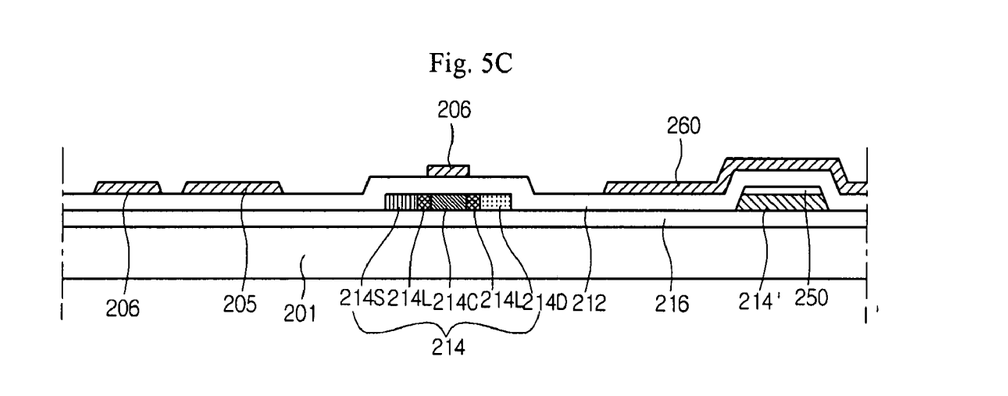

Referring to FIG. 5C, a gate insulating layer 212 is formed over the active layers 214 and 214' and the storage line 250. The gate insulating layer 212 is formed mainly of an inorganic insulating material, such as silicon oxide ($SiO_x$). A transparent conductive material is then coated onto the gate insulating layer 212 and patterned to form a pixel electrode 260, a gate electrode 206, and a connection line 205. The transparent conductive material is one of indium-tin-oxide, indium-zinc-oxide, and indium-tin-zinc-oxide.

The gate electrode 206 is formed on the gate insulating layer 212 at a center portion of the first active layer 214. The pixel electrode 260 is formed to overlap the storage line 250 with the gate insulating layer 212 interposed therebetween to form a storage capacitor 209. The connection line 205 serves to interconnect two of the data lines 203.

A photoresist is then formed over the entire surface of the gate electrode 206 and is patterned by photolighography to form a photoresist pattern. The first active layer 214 is formed by ion implantation using the photoresist pattern as a mask. Thereafter, the photoresist pattern is removed. Specifically, a p-type TFT and the gate electrode 206 are blocked by the photoresist pattern, and the first active layer 214 is doped with n+ ions and n− ions using the photoresist pattern as a mask, thereby forming an LDD region 214L and source/drain regions 214S and 214D.

Although not shown in the drawings, after the photoresist pattern is removed, the n-type TFT is blocked by the photoresist pattern and p+ ions are doped using the photoresist pattern as a mask to form source/drain regions in the p-type TFT. The n-type TFT and the p-type TFT constitute the CMOS TFT of the driving units, which include a gate driving circuit unit and a data driving circuit unit. More specifically, the n-type TFT is doped with arsenic or phosphorous impurities, and the p-type TFT is doped with boron impurities in the source/drain regions of the first active layer, which does not include the LDD regions.

Figure 5D:
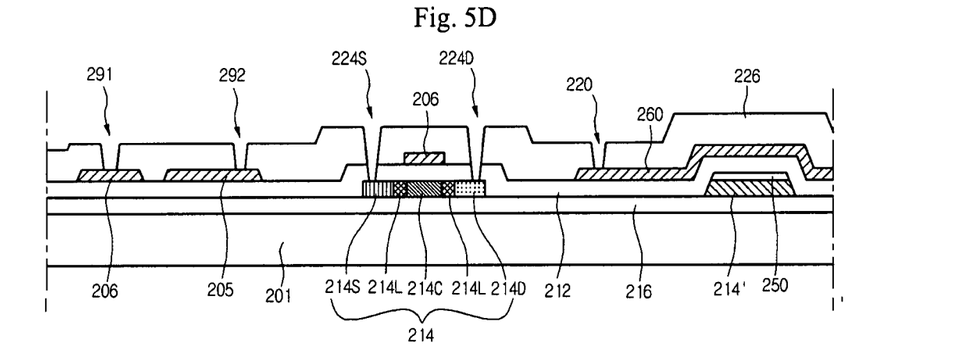

Referring to FIG. 5D, an interlayer insulating layer 226 is formed on the pixel electrode 260, the gate electrode 206, and the connection line 205. A photoresist (not shown) is coated on the interlayer insulating layer 226 to form source and drain contact holes 224S and 224D for exposing the source/drain regions 214S and 214D of the first active layer 214 through the gate insulating layer 212. Also, a gate contact hole 291 for exposing a portion of the gate electrode 206, a pixel contact hole 220 for exposing the pixel electrode 260, and a connection contact hole 292 for exposing the connection line 205 connecting the data line 203 are formed in the interlayer insulating layer 226.

Figure 5E:
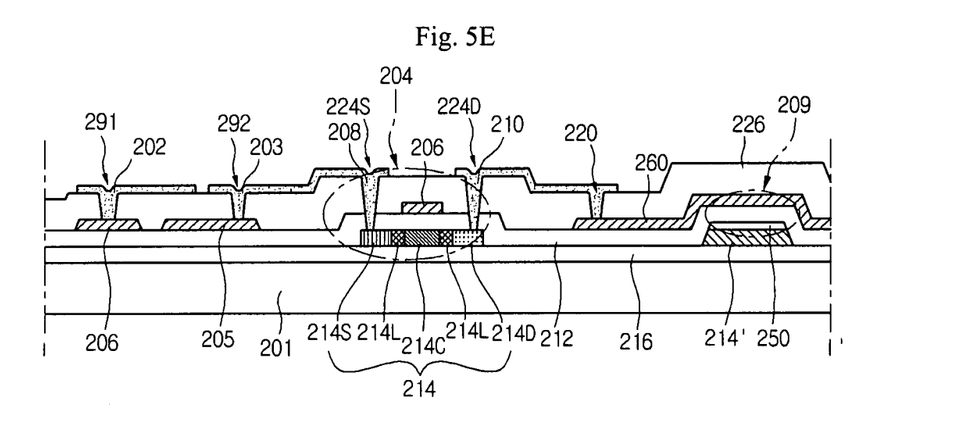

Referring to FIG. 5E, the photoresist pattern is removed, and a metal material is formed on the interlayer insulating layer 226. The metal material is one of molybdenum (Mo), aluminum (Al), titanium (Ti), tantalum (Ta), Mo alloy, and Al alloy. The metal material is patterned by photolighography to form source and drain electrodes 208 and 210, a data line 203, and a gate line 202. The data line 203 is segmented such that the data line 203 and the gate line 202 are disconnected from each other where they would otherwise cross each other. The source and drain electrodes 208 and 210 contact with the source/drain regions 214S and 214D of the first active layer 214 through the source and drain contact holes 224S and 224D. The data line 203 is electrically connected to the connection line 205 through the connection contact hole 292. The gate electrode 206 and the gate line 202 are electrically connected through the gate contact hole 291.

Figure 6:
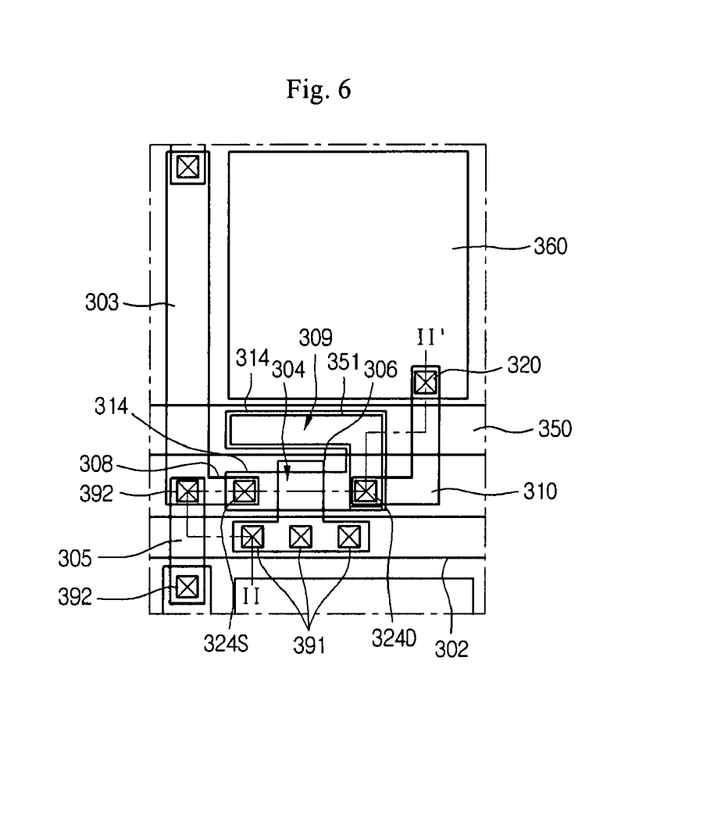
FIG. 6 is a plan view of an array substrate of an LCD according to another embodiment of the present invention.
Figure 7:
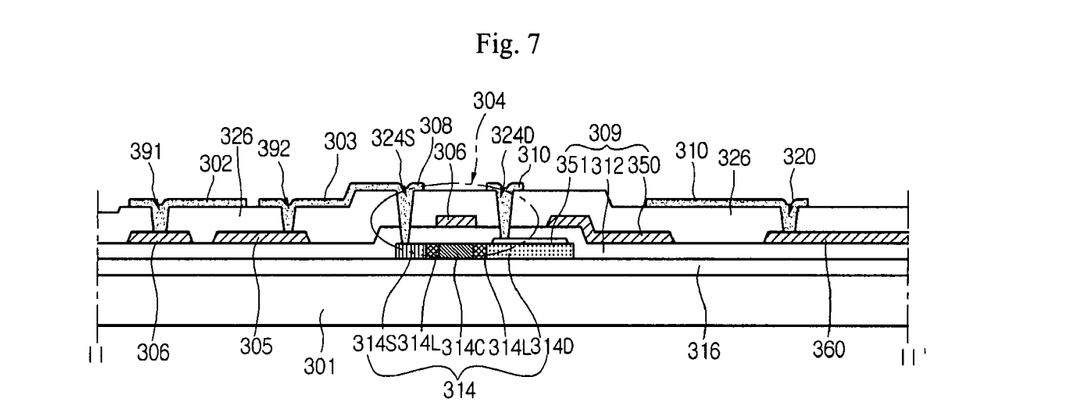
FIG. 7 is a cross-sectional view taken along line II-II' in FIG. 6.

FIG. 6 is a plan view of an array substrate of an LCD according to another embodiment of the present invention, and FIG. 7 is a cross-sectional view taken along line II-II' in FIG. 6. Referring to FIGS. 6 and 7, a gate line 302 and a data line 303 are arranged perpendicularly with respect to each other and are insulated from each other. A TFT 304 is disposed adjacent to where the gate line 302 and the data line segment 303 are closest to each other. A pixel region is defined between the gate line 302 and the data line 303. A pixel electrode 360 is connected to the TFT 304 and disposed within the pixel region. A gate electrode 306 of transparent conductive material is connected to the gate line 302. During the formation of the gate electrode 306, the pixel electrode 360 is also formed of the transparent conductive material in the pixel region. The TFT 304 switches in response to a scan pulse from the gate line 302 such that a video signal from the data line 303, that is, a pixel signal, is applied across the liquid crystal of the pixel region.

The gate line 302 is spaced apart from the data line 303 by a predetermined distance within a gap between two data lines 303. That is, the data line 303 is disconnected from the gate line 302 at the gap. The data line 303 on one side of the gap is electrically connected to the data line 303 on the other side of the gap by a connection line 305. Like the gate electrode 306, the connection line 305 is formed of a transparent conductive material.

In the TFT 304, the gate electrode 306 formed of a transparent conductive material is formed over a portion of an active layer 314 with a gate insulating layer 312 disposed therebetween. Source and drain electrodes 308 and 310 of the TFT are formed on the gate electrode 306 with an interlayer insulating layer 326 disposed therebetween such that they are spaced apart from each other by a predetermined distance. The active layer 314 of the TFT includes a channel region 314C overlapped by the gate electrode 306, a source region 314S contacting the source electrode 308 through a source contact hole 324S and implanted with n+ ions, a drain region 314D contacting the drain electrode 310 through a drain contact hole 324D and implanted with n+ ions, and LDD regions 314L formed between the channel region 314C and the drain region 314D, and between the channel region 314C and the source region 314S.

A capacitor electrode 351 is formed to extend from a portion between the drain region 314D and the drain electrode 310. That is, the drain electrode 310 is electrically connected to the drain region 314D of the active layer 314 through the capacitor electrode 351. The capacitor electrode 351 is stacked on the drain region 314D of the active layer 314 on a buffer layer 316. A storage line 350 is formed of the transparent conductive material in the same direction of the gate line 302 on the capacitor electrode 351 with the gate insulating layer 312 interposed therebetween, thereby forming a storage capacitor 309. The buffer layer 216 is formed over the surface of a substrate 201.

The gate electrode 306, the connection line 305, and the pixel electrode 360 are formed of the same material, that is, the transparent conductive material. The transparent conductive material is one of indium-tin-oxide (ITO), indium-zinc-oxide (IZO), and indium-tin-zinc-oxide (ITZO). Further, the gate electrode 306, the connection line 305, and the pixel electrode 360 are formed on the gate insulating layer 312.

The interlayer insulating layer 326 is formed over the TFT 304 and the storage capacitor 309. A gate contact hole 391 for exposing the gate electrode 306, source and drain contact holes 324S and 324D for exposing the source and drain regions 314S and 314D, a pixel contact hole 320 for exposing the pixel electrode 360, and a connection contact hole 392 for exposing a portion of the connection line 305 are formed through the interlayer insulating layer 326. The source electrode 308 extends from the data line 303 to contact the source region 314S of the active layer 314 through the source contact hole 324S, and the drain electrode 310 is spaced apart from the source electrode 308 by a predetermined distance to contact the capacitor electrode 354 through the drain contact hole 324D and to be electrically connected to the drain region 314D of the active layer 314. The drain electrode 310 contacts the pixel electrode 360 through the pixel contact hole 320, and the data line 303 contacts the connection line 305 through the connection contact hole 392.

Although not shown in the drawings, a gate driving circuit unit and a data driving circuit unit each include a plurality of p-type TFTs and n-type TFTs connected in a CMOS structure. The n-type TFTs are doped with arsenic (As) or phosphorous (P) impurities, and the p-type TFTs are doped with boron (B) impurities in the source and drain regions of the active layer.

In the above embodiments, the connection line is formed to connect data lines across a gap through which the gate line passes through. Alternatively, the gate lines can be segmented and the segmented gate lines are electrically connected by the connection line.

As described above, the storage line and the active layer are formed by diffraction exposure, the gate electrode, the pixel electrode and the connection line are formed using a transparent conductive material, and the gate line and the date line segments are formed using the source and drain electrode metal. Accordingly, the manufacturing process can be simplified to improve the production yield and to reduce the manufacturing cost.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of manufacturing a liquid crystal display device, comprising:

sequentially forming silicon and a first metal material over a substrate;

forming a first silicon pattern, and a stack of a second silicon pattern and a storage line formed to contact the second silicon pattern using a diffraction mask;

forming a first insulating layer on the substrate including the first silicon pattern, and the stack of the second silicon pattern and the storage line;

forming a second metal material on the substrate and patterning the second metal material to concurrently form a gate electrode, a pixel electrode, and a connection line;

performing ion implantation on the first silicon pattern to form an active layer;

forming a second insulating layer including a plurality of contact holes for exposing the first active layer, the gate electrode, the pixel electrode, and the connection line; and forming a third metal material over the second insulating layer and patterning the third metal material to form a gate line connected to the gate electrode, source and drain electrodes connected to the active layer, and a data line connected to the connection line.

2. The method according to claim 1, wherein the diffraction mask has patterns including a full exposure portion, a partial exposure portion, and a full block portion, the first silicon pattern is formed by the partial exposure portion, and the stack of the second silicon pattern and the storage line are formed by the full block portion.

3. The method according to claim 1, wherein the silicon includes polysilicon crystallized from amorphous silicon.

4. The method according to claim 1, wherein the second metal material includes a transparent conductive material.

5. The method according to claim 4, wherein the transparent conductive material includes one of indium-tin-oxide, indium-zinc-oxide, and indium-tin-zinc-oxide.

6. The method according to claim 1, wherein the contact holes include a first contact hole for exposing source and drain regions of the active layer, a second contact hole for exposing the gate electrode, a third contact hole for exposing the connection line, and a fourth contact hole for exposing the pixel electrode.

7. The method according to claim 1, wherein the data line includes a first data line and a second data line disconnected from the gate line.

8. The method according to claim 7, wherein the connection line is formed to connect the first and second data lines through the second insulating layer.

9. The method according to claim 1, wherein the gate line includes a first gate line and a second gate line disconnected from the data line.

10. The method according to claim 7, wherein the connection line is formed to connect the first and second gate lines through the second insulating layer.

11. The method according to claim 1, wherein the storage line is formed to be substantially parallel to the gate line and overlap the pixel electrode with the first insulating layer interposed therebetween.

12. The method according to claim 11, wherein the first insulating layer together with the storage line and the pixel electrode form a storage capacitor.

13. A method of manufacturing a liquid crystal display device, comprising:

sequentially forming silicon and a first metal material over a substrate;

forming a silicon pattern and a first electrode formed to contact the silicon pattern using a diffraction mask;

forming a first insulating layer over the silicon pattern and the first electrode;

forming a second metal material over the first insulating layer and patterning the second metal material to concurrently form a gate electrode, a pixel electrode, a second electrode, and a connection line;

performing ion implantation on the silicon pattern to form an active layer;

forming a second insulating layer including a plurality of contact holes for exposing the active layer, the gate electrode, the pixel electrode, and the connection line; and forming a third metal material over the second insulating layer and patterning the third metal material to form a gate line connected to the gate electrode, source and drain electrodes connected to the active layer, and a data line connected to the connection line.

14. The method according to claim 13, wherein the second electrode is formed on the first insulating layer to overlap the first electrode.

15. The method according to claim 14, wherein the first electrode is connected to a drain region of the active layer, and the first insulating layer together with the first and second electrodes forms a storage capacitor.

16. The method according to claim 13, wherein the diffraction mask has patterns including a full exposure portion, a partial exposure portion, and a full block portion, the silicon pattern is formed by the partial exposure portion, and the first electrode is formed by the full block portion.

17. The method according to claim 13, wherein the silicon includes polysilicon crystallized from amorphous silicon.

18. The method according to claim 13, wherein the second metal material includes a transparent conductive material.

19. The method according to claim 18, wherein the transparent conductive material includes one of indium-tin-oxide, indium-zinc-oxide, and indium-tin-zinc-oxide.

20. The method according to claim 13, wherein the contact holes include a first contact hole for exposing source and drain regions of the active layer, a second contact hole for exposing the gate electrode, a third contact hole for exposing the connection line, and a fourth contact hole for exposing the pixel electrode.

21. The method according to claim 13, wherein the data line includes a first data line and a second data line disconnected from the gate line.

22. The method according to claim 21, wherein the connection line is formed to connected the first and second data lines through the second insulating layer.

23. The method according to claim 13, wherein the gate line includes a first gate line and a second gate line disconnected from the data line.

24. The method according to claim 23, wherein the connection line is formed to connect the first and second gate lines through the second insulating layer.

25. The method according to claim 7, wherein the gate line is formed passing through a gap between the first data line and the second data line.

26. The method according to claim 9, wherein the data line is formed passing through a gap between the first gate line and the second gate line.

27. The method according to claim 21, wherein the gate line is formed passing through a gap between the first data line and the second data line.

28. The method according to claim 23, wherein the data line is formed passing through a gap between the first gate line and the second gate line.

* * * * *